(12) United States Patent
Nelles et al.

(10) Patent No.: US 7,061,009 B2
(45) Date of Patent: Jun. 13, 2006

(54) SOLID CONJUGATED SEMICONDUCTOR DEVICE HAVING AN UNMODIFIED HOLE TRANSPORT MATERIAL

(75) Inventors: Gabriele Nelles, Stuttgart (DE); Akio Yasuda, Stuttgart (DE); Stephane Gaering, Buhl (FR); Hans-Werner Schmidt, Bayreuth (DE); Mukundan Thelakkat, Bayreuth (DE); Karickal Raman Haridas, Kerala (IN)

(73) Assignee: Sony International (Europe) GmbH, Berlin (DE)

( * ) Notice: Subject to any disclaimer, the term of this patent is extended or adjusted under 35 U.S.C. 154(b) by 196 days.

(21) Appl. No.: 10/234,543

(22) Filed: Sep. 3, 2002

(65) Prior Publication Data

US 2003/0067000 A1 Apr. 10, 2003

(30) Foreign Application Priority Data

Sep. 4, 2001 (EP) .............................................. 01121179

(51) Int. Cl.
*H01L 35/24* (2006.01)

(52) U.S. Cl. ........................................................ 257/40
(58) Field of Classification Search .................... 257/40
See application file for complete search history.

(56) References Cited

U.S. PATENT DOCUMENTS 4,338,222 A 7/1982 Limburg et al.
5,853,906 A * 12/1998 Hsieh ......................... 428/690
5,943,154 A * 8/1999 Nakayama .................. 359/244
6,171,765 B1 * 1/2001 Sheats ........................ 430/330
6,306,555 B1 * 10/2001 Schulz et al. ............. 430/270.1
6,340,528 B1 * 1/2002 Hsieh et al. ................ 428/412
6,700,058 B1 * 3/2004 Nelles et al. ............... 136/263
2002/0070662 A1 * 6/2002 Moriyama et al. .......... 313/504

FOREIGN PATENT DOCUMENTS

DE 197 11 713 10/1998

OTHER PUBLICATIONS

Aasmundveit K E et al: "Structural Aspects of Electrochemical Doping and Dedoping of Poly (3, 4–Ethylenedioxythiophene)" Synthetic Metals, Elsevier Sequoia, Lausanne, Ch, vol. 113, No. 1/2, 15 ISSN: 0379–6779.

* cited by examiner

*Primary Examiner*—W. David Coleman
(74) *Attorney, Agent, or Firm*—Frommer Lawrence & Haug LLP; William S. Frommer (57) ABSTRACT

The present invention relates to a device having a solid conjugated semiconductor comprising a hole transport material (HTM), wherein the hole transport material is mixed with oxidized hole transport material as a dopant; to a mixture which can be used as doped hole transport material; and to methods for the preparation of devices having a solid conjugated semiconductor. The present invention also relates to a solar cell comprising such a device and to other devices made with conjugated semiconductors, such as diodes (LEDs), transistors etc.

20 Claims, 7 Drawing Sheets

Fig. 6 a) I/V-characteristic after preparation

Fig. 7a b) I/V-characteristic after 6 months

Fig. 7b

SOLID CONJUGATED SEMICONDUCTOR DEVICE HAVING AN UNMODIFIED HOLE TRANSPORT MATERIAL

The present invention relates to a device having a solid conjugated semiconductor, doped hole transport materials, solar cells comprising the same and methods for the preparation of such devices.

Since the demonstration of crystalline silicon p/n junction solar cell in 1954 by Chapin et al with a reported efficiency of 6%, there was a dramatic increase in the efficiencies of such cells as a result of improvements in current, significant increase in voltage and splitting the sunlight among solar cells of different bandgaps. The higher voltages resulted directly from increasing the densities of minority carriers generated by absorbed sunlight. By reducing the minority carrier recombination rate, trapping light in active layers and by increasing the intensity of light with concentration optics, efficiencies as high as 25–30% have been reported for two band-gap single crystal laboratory cells like AlGaAs/GaAs. Thin film multijunction, multiband-gap cells using hydrogenated amorphous silicon or polycrystalline alloys exhibit up to 15% laboratory efficiency. The efficiencies of commercial power systems in the field remain in the range of 3 to 12%.

As an alternative a dye sensitized semiconductor-electrolyte solar cell was developed by Grätzel et al consisting of titanium dioxide nanoparticles with a ruthenium complex adsorbed on the surface of an iodine-iodide electrolyte as disclosed in WO91/16719. The ruthenium complex acts as a sensitizer, which absorbs light and injects an electron into titanium dioxide; the dye is then regenerated by electron transfer from the iodine-iodide redox couple. The advantage of such a solar cell results from the fact that no crystalline semiconductors have to be used anymore while already providing conversion efficiencies of light into electrical energy of up to 12% (O'Reagan, B. et al; Nature (1991), 353, page 737).

However, replacement of the liquid electrolyte with solid charge transport material has been found important due to practical applications. Solid-state dye sensitized solar cells on nanoporous film of $TiO_2$ are a significant area of research for chemists, physicists and material scientists. These researches on solar cells became very important due to its low costs and the easiness of fabrication.

In the field of dye sensitized solid state solar cells, Hagen et al, Synethic Metals 89, 1997, 215, reports for the first time the concept of a new type of solid-state dye sensitized solar cell using organic hole transport material (HTM), which was further improved by Bach et al, Nature 398, 1998, 583, to obtain an overall conversion efficiency of 0.74%. The basic structure of the cell consists of a nanoporous $TiO_2$ layer coated on a conducting glass substrate, covered with a compact $TiO_2$ layer. Dye was absorbed by the nanoporous layer and the HTM along with dopant and salt was coated over the dye. The additives, salt and dopant (tris (4-bromophenyl)ammoniumyl hexachloroantimonate $(N(PhBr)_3SbCl_6)$ increased the efficiency.

Further, organic molecules with large conjugated π-system have long been known to act as semiconductors in the solid state. Conjugated semiconductors can exhibit energy bandgaps of 1 eV up to several eV depending on the choice of the structure and their arrangement. However such bandgaps lead to a very low intrinsic conductivity.

Most of the useful properties of semiconductors occur only if they are doped, depending on the application with small p- or n-type molecules. Improvements of the properties due to doping are most often related to higher conductivity resulting in a lower series resistance of the devices, to shifted adsorption edges or workfunction, to increased internal quantum efficiencies.

Doping will allow the construction of any device traditionally made with inorganic semiconductors like silicon, including diodes, transistors and photovoltaic cells. In solid state photovoltaic cells only small molecule doping is known.

To summarize, the specific conductivity of thin organic films is one of the most important properties that determines whether an organic semiconductor is suitable to be used in electronic devices. Conjugated semiconductors can exhibit energy bandgaps of 1 eV up to several eV depending on the choice of the structure and their arrangement. Such bandgaps lead to a very low intrinsic conductivity. To improve the conductivity, organic semiconductors are doped by adding either electron acceptors (p-type) or electron donors (n-type). However, one disadvantage of many doped systems known in the prior art is their instability. For example, iodine has the tendency to diffuse out of the layer and damages electrode material. Furthermore, phase separation and degradation is a problem in known doped semiconductors, and the addition of dopants of the prior art complicates the electronic structure at the interfaces of the layers making the understanding of these solar cells difficult.

It is therefore an object of the present invention to overcome the drawbacks of the prior art, especially to provide a device having a solid conjugated semiconductor having an increased stability compared to the respective devices known in the prior art and avoiding phase separation and degradation.

A further object of the present invention is to provide a mixture which can be used as doped hole transport material.

A still further object of the present invention is to provide a method for preparation of a device having a solid conjugated semiconductor, more particularly of a device exhibiting the favorable characteristics as defined above.

This object is solved in a first aspect by a device having a solid conjugated semiconductor comprising an unmodified hole transport material, wherein the unmodified hole transport material is mixed with oxidized hole transport material as a dopant, preferably an only dopant.

It is preferred that the (unmodified) hole transport material is represented by formula (I)

TDAB wherein R in each occurrence is dependently selected from hexyl and ethylhexyl within the wt % ratio of hexyl:ethylhexyl being about 40: about 60, or represented by formula (II)

Spiro-MeO-TAD or represented by formula (III)

mTDATA

Further, a photovoltaic device is preferred, wherein the oxidized hole transport material is present in the mixture with the unmodified hole transport material in a range of about 0.01 wt % to 10 wt %, preferably in a range of about 0.08 to 1.2 wt %.

It is preferred that the device further comprises a semiconductor oxide layer sensitized with a dye.

In a further embodiment the dye is a ruthenium complex.

In another embodiment of the inventive device the semiconductor oxide layer is porous.

In a preferred embodiment the semiconductor oxide layer comprises nanoparticles, preferably nanoparticles of $TiO_2$.

In a further aspect the object is solved by a mixture comprising unmodified hole transport material and oxidized hole transport material.

In a further aspect the problem is solved by the use of the inventive mixture in any of the inventive devices, particularly as a doped hole transport material.

In a still further aspect the problem is solved by the use of the inventive mixture for the manufacture of any of the inventive devices, particularly as a doped hole transport material.

The problem is also solved by a method for preparing of a device having a solid conjugated semiconductor, preferably any of the inventive devices comprising the steps of:

(i) oxidizing hole transport material;
(ii) mixing the oxidized hole transport material with unmodified hole transport material; and
(iii) applying the mixture to a semiconductor oxide layer.

Preferred is a method, wherein the hole transport material in step (i) is chemically oxidized.

Preferably, unreacted reactants and reduced oxidants are removed prior mixing step (ii).

Further preferred is a method, wherein the oxidation is carried out using silver hexafluoroantimonate ($AgSbF_6$) ornitrosonium tetrafluoroborate ($NOBF_4$).

Still further preferred is a method, wherein by oxidation radical cations of the hole transport material are obtained.

In a further embodiment of the inventive method the method further comprises at least one of the following steps:
providing a semiconductor oxide layer,
applying said mixture to said semiconductor oxide layer, and
connecting electrodes to said semiconductor oxide layer and to said mixture.

In a further aspect the problem is solved by a solar cell comprising an inventive device.

Preferred is a solar cell, wherein the solar cell is a solid state solar cell.

Surprisingly, it was found that with the device having a solid conjugated semiconductor according to the present invention no phase separation and degradation of hole transport material and dopant occurs since they have basically the same structure. Moreover, the stability is much improved compared to the stability of prior art devices resulting in an increased energy conversion efficiency. In contrast to the prior art, no small molecules are added as dopants to the conjugated semiconductor according to the present invention, that means that no additional cation is present in the hole transport material layer. With the concept of the present invention it is possible to prepare an individual dopant for each hole transport material. The doping according to the present invention may be called "in situ" doping.

The way of doping according to the present invention may be applied to the construction of any device made with conjugated organic and polymeric semiconductors, including diodes (LEDs), transistors, photovoltaic cells, etc.

Besides the hole transport materials already disclosed in the application, other compounds are as well suitable and may comprise linear as well as branched or starburst structures and polymers carrying long alkoxy groups as sidechains or in the backbone. Such hole transport materials are in principle disclosed in EP 0 901 175 A2, the disclosure of which is incorporated herein by reference.

Other possible hole transport materials are, e.g. described in the WO 98/48433, DE 19704031.4 and DE 19735270.7. The latter two references disclose TDAB for application in organic LEDs. It is to be noted that any of the known TDAB may be—further-derivatized such as by using substitutions such as alkoxy, alkyl, silyl at the end-standing phenyl rings which could be in p-, m- and o-position mono-, bi-, or tri-substituted. As indicated already above the guidelines disclosed herein apply not only to single organic hole transport materials but also to mixtures thereof.

Dyes which can be used for sensitizing a semiconductor oxide layer are known in the art such as EP 0 887 817 A2 the disclosure of which is incorporated herein by reference. Among the dyes to be used are also Ru(II) dyes.

The dyes used to sensitize the semiconductor oxide layer may be attached thereto by chemisorption, adsorption or by any other suitable ways.

The semiconductor oxide layer used in the inventive device is preferably a nanoparticulate one. The material can be a metal oxide and more preferably an oxide of the transition metals or of the elements of the third main group, the fourth, fifth and sixth subgroup of the periodic system. These and any other suitable materials are known to those skilled in the art and are, e.g. disclosed in EP 0 333 641 A1, the disclosure of which is incorporated herein by reference.

The semiconductor oxide layer material may exhibit a porous structure. Due to this porosity the surface area is increased which allows for a bigger amount of sensitizing dye to be immobilized on the semiconductor oxide layer and thus for an increased performance of the device. Additionally, the rough surface allows the trapping of light which is reflected from the surface and directed to neighbouring surface which in turn increases the yield of the light.

The method for the manufacture of a device according to the present invention can be exemplary summarized as follows.

I. Structuring of TCO (transparent conductive oxide layer) substrates
II. Cleaning of TCO substrates
  a. Ultrasonic cleaning 15 minutes in an aqueous surfactant at ca. 70° C.
  b. Rinse thoroughly with ultrapure water and dry in air
  c. Ultrasonic rinsing with ultrapure water 15 min at ca. 70° C.
  d. Ultrasonic cleaning 15 minutes in pure isopropanol at ca. 70° C.
  e. Blow dry with nitrogen
III. Preparation of blocking layer
  a. Making polycrystalline $TiO_2$ by spray pyrolysis of titanium acetylacetonate solution.
  b. Temper film at 500° C.
IV. Preparation of nanoporous $TiO_2$ semiconductor oxide layer
  a. Screen printing: use a $TiO_2$ paste with a screen structured with the desired geometry (thickness depends on screen mesh); resulting standard thickness is about 3 μm; doctor blading is an alternative technique to make porous $TiO_2$ layer
  b. Sintering of film
    1. Heat the substrates up to 85° C. for 30 minutes to dry the film
    2. Sinter at 450° C. for ½ hour, ideally under oxygen flow, otherwise in air
    3. Let sample cool down slowly to avoid cracking
V. Dyeing of nanocrystalline $TiO_2$ semiconductor oxide film
  a. Prepare a solution of dye in ethanol, concentration ca. $5 \times 10^{-4}$ M
  b. Put the ca. 80° C. warm substrates into the dye solution.
  c. Let them sit in the dye-solution at room temperature in the dark for about 8 hours or overnight.
  d. Remove from dye solution, rinse with ethanol and let dry several hours or overnight in the dark.
VI. Deposition of hole transport material
  a. Prepare a solution of HTM. Current "standard conditions" are:
    Solvent: chlorobenzene (plus ca. 10% acetonitrile from dopant solution)
    HTM: concentration (5–60 mg/substrate)
    Dopant: oxidized HTM (ca. 0,2 mol % of hole conductor concentration, to be added from a solution in acetonitrile)
    Salt: $Li((CF_3SO_2)_2N)$, (ca. 9 mol %)
  b. Spin-coat the solution onto the film
  c. Let the samples dry at least several hours in air or preferably overnight
VII. Deposition of counterelectrode
  a. Evaporate the counterelectrode on top (currently Au)

As is understood changes may be done in that method without departing from the scope of protection.

The invention is now further illustrated by the accompanying figures from which further embodiments, features and advantages may be taken and where.

PREPARATION OF RADICAL CATION SALTS (RCS)

Experimental

Materials: three different hole transport materials were used, 2,2',7,7'-tetrakis-(diphenylamino)-9,9'-spirofluorene (spiro-MeO-TAD) and m-trimethyl-diphenylamino-triamine (mTDATA) are commercially available by Covlon and SynTec, respectively. The third hole transport material, TDAB is a mixture of tris(methoxyphenyl hexyloxy phenyl amino)benzene (MH-TDAB) and tris(methoxyphenyl ethylhexyloxy phenyl amino)benzene (MEH-TDAB), prepared according to literature. The solvents used were freshly distilled and dried under argon atmosphere. The materials silver hexafluoroantimonate and nitrosonium tetrafluoroborate (Aldrich) were used as received.

Radical cations salts were prepared with two different anions, namely $SbF_6^-$ anion and $BF_4^-$ anion.

EXAMPLE 1

Preparation of RCS Spiro-$SbF_6^-$ 0.49 g (0.0004 mol) of spiro-MeO-TAD was dissolved in 70 ml toluene under argon atmosphere. To this, 0.5 g (0.0016 mol) of silver hexafluoroantimonate dissolved in 40 ml toluene was added under argon atmosphere. The mixture was allowed to stir at room temerature for 30 minutes, the dark green solid was filtered out, washed with toluene to remove the unreacted reactants and dried in vacuum. It was then dissolved in chloroform, filtered to remove the silver. The product was reprecipitated from ether. This was repeated for three times. The product was dried in vacuum to yield 0.380 g of RCS spiro-$SbF_6^-$.

EXAMPLE 2

Preparation of RCS Spiro-$BF_4^-$

The same procedure was used as in example 1 above with 0.49 g (0.0004 mol) spiro MeO-TAD and 0.1869 g (0.0016 mol) nitrosonium tetrafluoroborate, yielding 0.420 g of the desired product.

EXAMPLE 3

Preparation of RCS TDAB $BF_4^-$

The procedure was the same as used in example 1 above but using 0.4076 g (0.0004 mol) TDAB in 30 ml toluene and 0.1402 g (0.0012 mol) nitrosonium tetrafluoroborate in 40 ml toluene, yielding 0.120 g of RCS TDAB $BF_4^-$.

EXAMPLE 4

Preparation of RCS mTDATA $SbF_6^-$

The procedure was the same as for example 1 above but using 0.789 g (0.001 mol) mTDATA in 30 ml toluene and 1.3745 g (0.004 mol) silver hexafluoroantimonate in 40 ml toluene yielding 1.12 g of the desired product.

Figure 5:
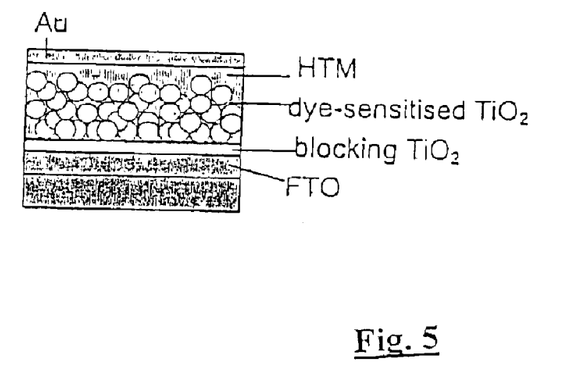
FIG. 5 shows the basic design of the inventive solar cell.

Hybrid solar cells according to the present invention have the basic structure given in FIG. 5.

Figure 6:
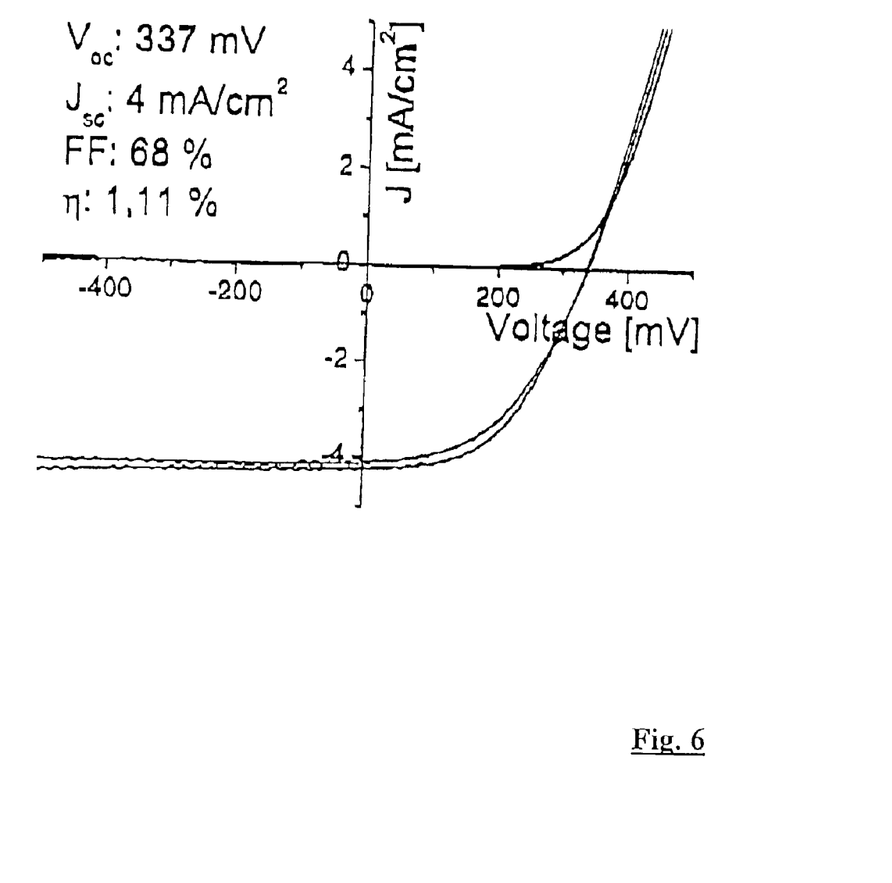
FIG. 6 shows the I/V curve of a first type of solar cell prepared with 0.1 wt % of oxidized Spiro MeO-TAD (light source:sulphur lamp, white light 100 mW/cm², measured withpower meter at 530 nm)

The I/V curve of a first type of solar cell prepared with 0.1 weight percent of oxidized spiro MeO-TAD is shown in FIG. 6 and the corresponding parameters are shown in table 1 below.

TABLE 1

| dopant | $V_{OC}$[mV] | $J_{SC}$[mA/cm$^2$] | FF[%] | η[%] |
|---|---|---|---|---|
| 0.1 w % | 337 | 4.0 | 68 | 1.11 |

The radical cation salts (RCS) are soluble in solutions such as chloroform, chlorobenzene, acetone and alcohol. They are deep blue or greenish blue in solution. The chloroform solution is stable for more than one week.

To compare the stability of the doped hole transport system according to the present invention with system known in the prior art, UV spectra of hole transport material doped with various dopants were taken on a Hitachi U-3000 spectrophotometer.

Figure 1:
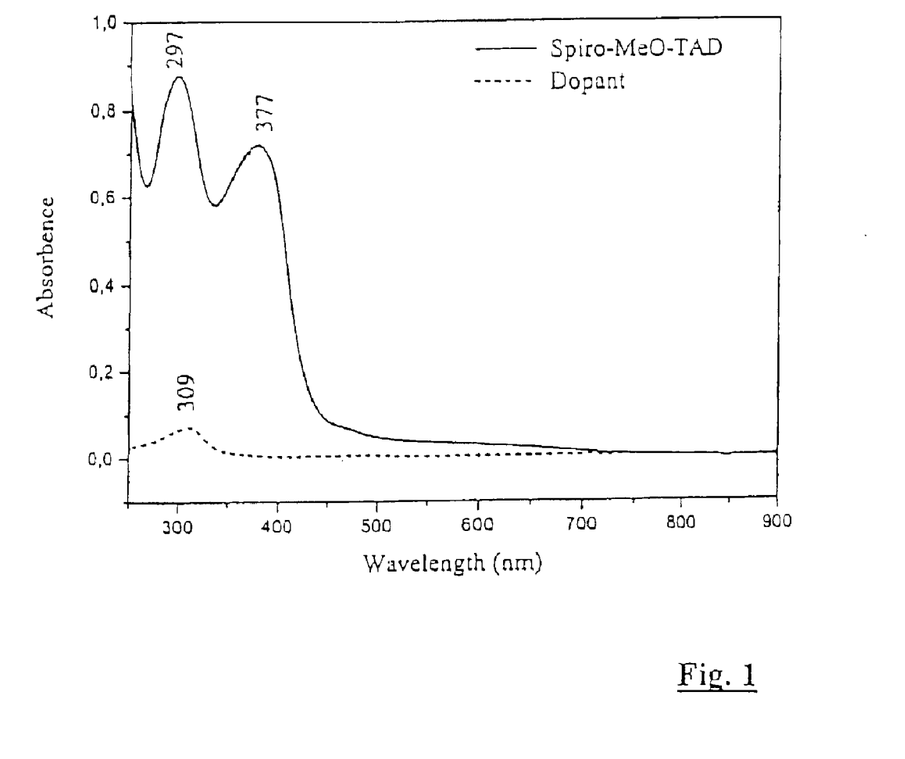
FIG. 1 is a UV-Vis spectra of dopant $N(PhBr)_3SbCl_6$ and spiro-MeO-TAD in chloroform at a concentration of $10^{-5}$M.

FIG. 1 shows the UV spectra of pristine spiro-MeO-TAD and dopant $N(PhBr)_3SbCl_6$) in chloroform at a concentration of $10^{-5}$M. The absorption value of dopant is found to be at 309 nm and that of spiro-MeO-TAD at 297 and 357 nm.

Figure 2:
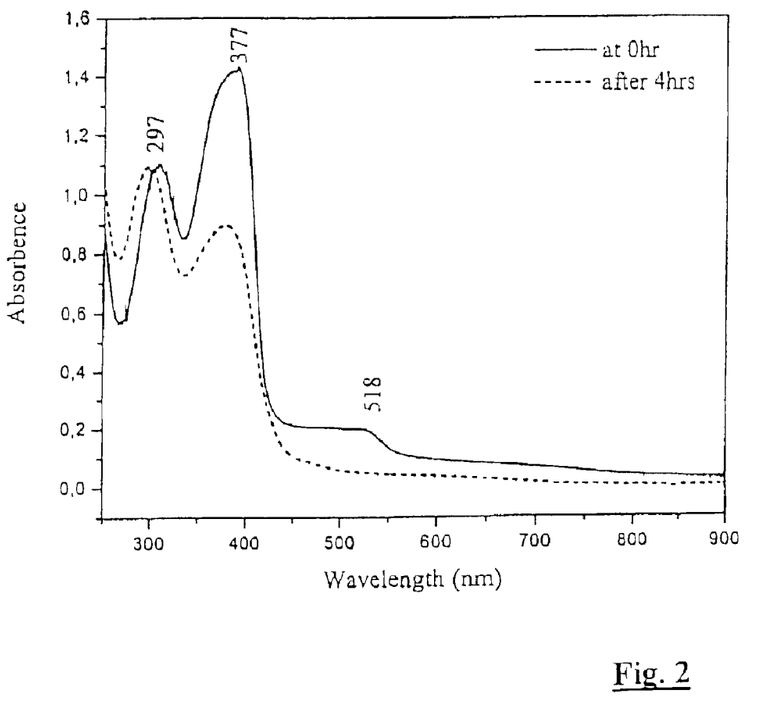
FIG. 2 is a UV-Vis spectra of spiro-MeO-TAD doped with dopant $N(PhBr)_3SbCl_6$ (10% by weight) in chloroform at a concentration of $10^{-5}$M at 0 hour and after 4 hours.

The UV-Vis spectra of the spiro-MeO-TAD doped with 10 percent by weight of dopant $N(PhBr)_3SbCl_6$ in chloroform at a concentration of $10^{-5}$ M are shown in FIG. 2. As can be seen, there is not much shift in these absorption when the spiro compound is mixed with the dopant, but in addition to the above two strong absorption values at 297 and 357 nm, there is a new absorption at 518 nm. This may be due to the formation of charge-transfer complex between the hole transport material and the dopant resulting in higher conductivity of the hole transport material due to the creation of positive centers which is responsible for the increase in the efficiency of the solar cell with the addition of the dopant. The new species may be a radical cation. It was observed that the color of the solution is diminishing with time and become colorless within hours. The same was observed for the other two hole transport materials also. This indicated that the new species obtained by the addition of the dopant to the hole transport material is unstable. FIG. 2 shows the UV-Vis spectra of the spiro compound doped with the dopant $N(PhBr)_3SbCl_6$ immediately after mixing (at zero hour) and after four hours. In comparison, it is clear that the absorption at 518 nm is vanished after four hours, not only that the intensity of the absorption at 377 nm is also lowered. This shows that the newly formed species is very unstable and the life time of this species is less than four hours. To make the system stable, it is therefor necessary to have stable material, which has the similar structure and physical properties of the hole transport material. To achieve this, the hole transport material was chemically oxidized into a radical cation salt and then mixed with the unmodified hole transport material.

Figure 3:
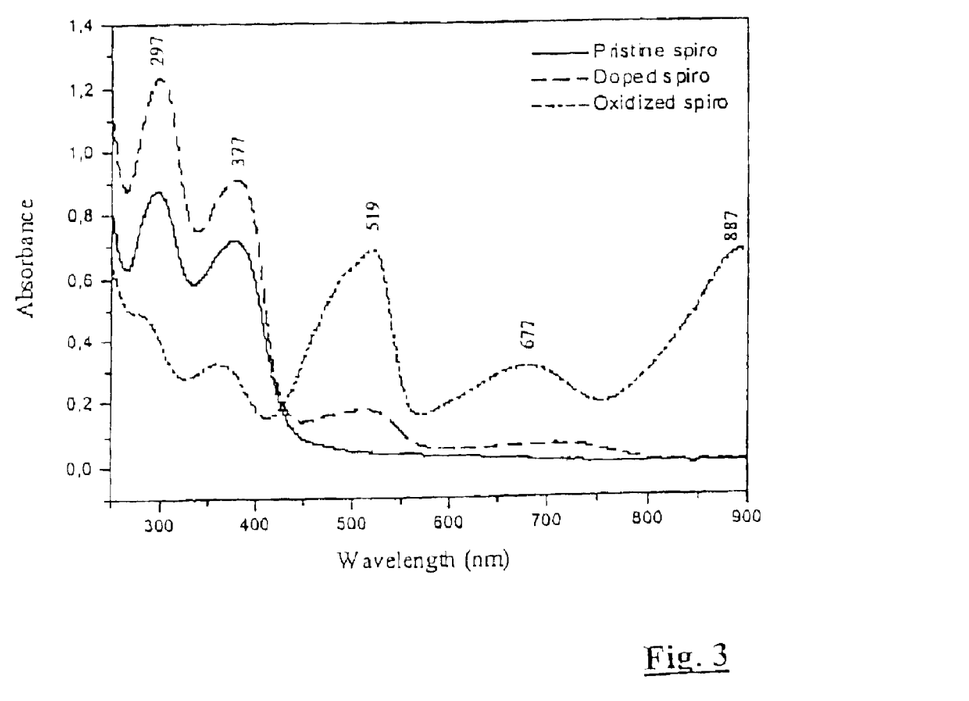
FIG. 3 is a UV-Vis spectra of pristine spiro-MeO-TAD, spiro doped with dopant $N(PhBr)_3SbCl_6$ (10% by weight) and oxidized spiro in chloroform at a concentration of $10^{-5}$ M.

FIG. 3 show the UV-Vis spectra of pristine spiro compound, Spiro compound doped with dopant $N(PhBr)_3$ $SbCl_6$ (10% by weight) and oxidized spiro compound (oxidized with $AgSbF_6$), in chloroform at a concentration of $10^{-5}$M. The similarity in absorption at 519 nm of the RCS spiro-$SbF_6^-$ with that of the prior art doped spiro compound indicates that the species formed by the chemical oxidation is similar in nature. In addition, there are two more new absorption at 677 and 887 nm found for the oxidized spiro compound.

Figure 4:
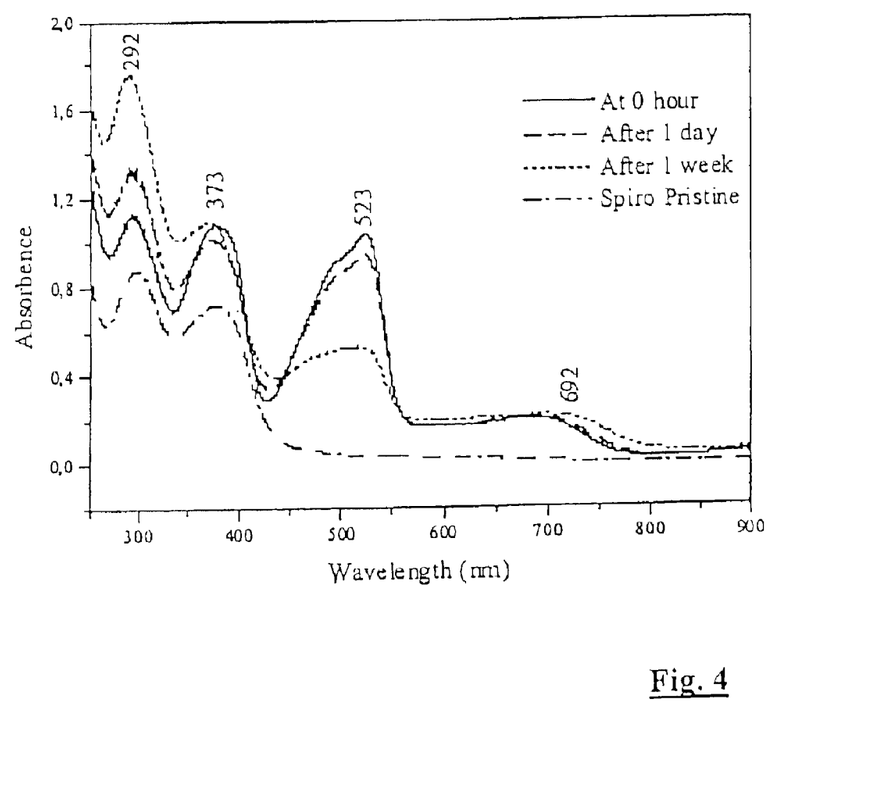
FIG. 4 is a UV-Vis spectra of pristine spiro-MeO-TAD and sprio doped with oxidized spiro (5% by weight) in chloroform at a concentration of $10^{-5}$M at 0 hour after one day and after one week.

To show the stability of the oxidized spiro compound, UV-Vis spectra were measured at different intervals. FIG. 4 shows the UV-Vis spectra of pristine and spiro compound doped with 5 percent by weight of oxidized spiro compound at zero hour, after one day and one week. Unlike the spiro compound doped with the dopant $N(PhBr)_3SbCl_6$, only slight changes in intensity of absorption could be found after one day. The oxidized spiro compound is still stable in solution after one week. This clearly indicates that the radical cation of the spiro compound obtained by chemical oxidation leads to a doped conjugated semiconductor, which shows improved characteristics compared to the dopedconjugated semiconductors known in the prior art, and therefore to an improved device having improved stability and no phase separation and degradation.

Figure 7A:
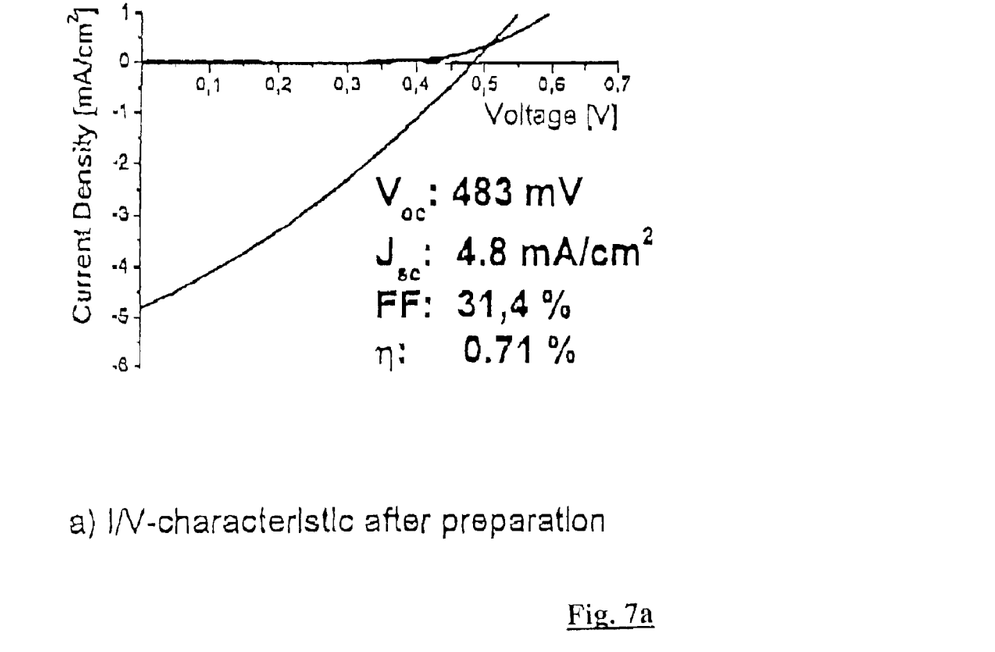
FIG. 7 shows the long term stability of the inventive solid solar cell over a period of 6 months.
  a) I/V-characteristic after preparation (light source: Oriel 75W Xenon arc lamp, white light 100 mW/cm² (measured with a power-meter at 550 nm);
  b) I/V-characteristic after 6 month (light source: Oriel 150 W Xenon arc lamp, AM 1,5 global, (calibration with Si-photodiode: 80 mW/cm²)).
Figure 7B:
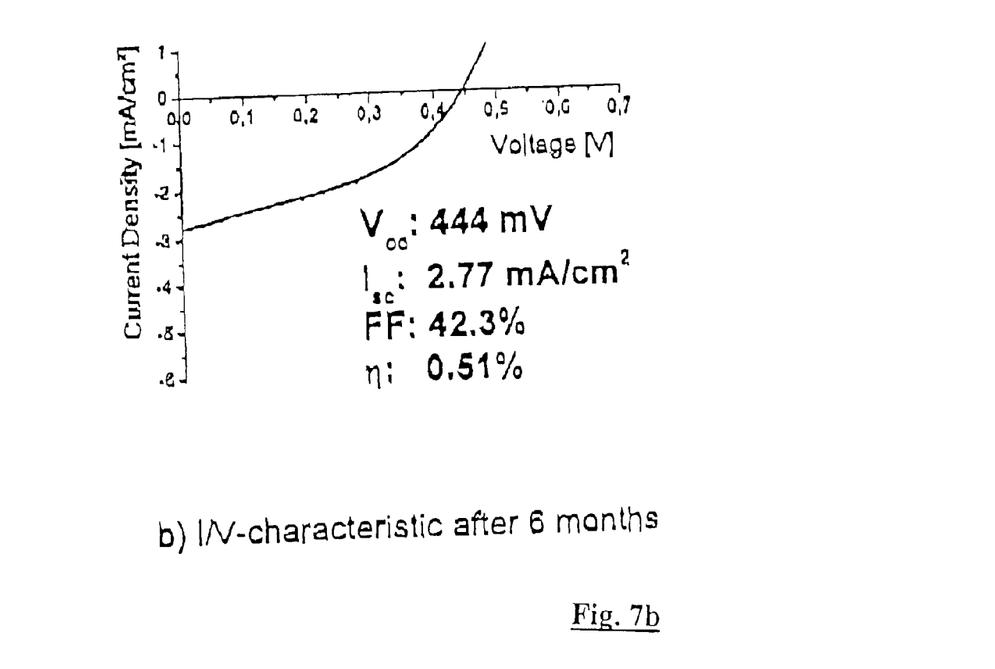

FIG. 7 proves the stability of the cells. After 6 month in air, the energy conversion efficiency of the solar cells decreases only form 0.7% to 0.5%. After the same period, solar cells of the prior art gave almost no $V_{CC}$ and $J_{SC}$.

The features of the present invention disclosed in the description, the claims and/or the drawings may both separately and in any combination thereof be material for realizing the invention in various forms thereof.

What is claimed is:

1. A device having a solid conjugated semiconductor, said device comprising:

an unmodified hole transport material, wherein the unmodified hole transport material is mixed with an oxidized hole transport material as a dopant, and wherein the oxidized hole transport material is present in the mixture with the unmodified hole transport material in a range of about 0.01 wt. % to 10 wt. %.

2. The device according to claim 1, wherein the unmodified hole transport material is represented by formula (I)

TDAB wherein R in each occurrence is dependently selected from hexyl and ethylhexyl within the wt % ratio of hexyl:ethylhexyl being about 40: about 60, or represented by formula (II)

Spiro-MeO-TAD or represented by formula (III)

mTDATA

3. A device having a solid conjugated semiconductor, said device comprising:

an unmodified hole transport material, wherein the unmodified hole transport material is mixed with an oxidized hole transport material as a dopant, and wherein the oxidized hole transport material is present in the mixture with the unmodified hole transport material in a range of about 0.08 wt. % to 1.2 wt %.

4. The device according to claim 1, wherein the device further comprises a semiconductor oxide layer sensitized with a dye.

5. The device according claim 4, wherein the dye is a ruthenium complex.

6. The device according to claim 4, wherein the semiconductor oxide layer is porous.

7. The device according to claim 4, wherein the semiconductor oxide layer comprises nanoparticles.

8. The device according to claim 7, wherein the nanoparticles are $TiO_2$ particles.

9. A mixture comprising:

an unmodified hole transport material and an oxidized hole transport material, wherein the oxidized hole transport material is present in the mixture with the unmodified hole transport material in a range of about 0.01 wt. % to 10 wt. %.

10. The mixture according to claim 9, wherein the mixture is utilized as a doped hole transport material in a device having a solid conjugated semiconductor.

11. The mixture according to claim 9, wherein the mixture is utilized as a doped hole transport material in the manufacture of a device having a solid conjugated semiconductor.

12. A method for preparing a device having a solid conjugated semiconductor, said method comprising the steps of:

oxidizing a hole transport material;

mixing the oxidized hole transport material with an unmodified hole transport material; and applying the mixture to a semiconductor oxide layer;

wherein the oxidized hole transport material is present in the mixture with the unmodified hole transport material in a range of about 0.01 wt. % to 10 wt. %.

13. The method according to claim 12, wherein the hole transport material in the oxidizing step is chemically oxidized.

14. The method according to claim 13, wherein unreacted reactants and reduced oxidants are removed prior to the mixing step.

15. The method according to claim 14, wherein the oxidation of the hole transport material is performed by using silver hexafluoroantimonate ($AgSbF_6$) or nitrosonium tetrafluoroborate ($NOBF_4$).

16. The method according to claim 12, wherein radical cations of the hole transport material are obtained by oxidation.

17. The method according to claim 12, further comprising at least one of the following steps:

providing a semiconductor oxide layer;

applying said mixture to said semiconductor oxide layer; or connecting electrodes to said semiconductor oxide layer and to said mixture.

18. A method for preparing a device having a solid conjugated semiconductor, said method comprising the steps of:

oxidizing a hole transport material;

mixing the oxidized hole transport material with an unmodified hole transport material; and applying the mixture to a semiconductor oxide layer;

wherein the oxidized hole transport material is present in the mixture with the unmodified hole transport material in a range of about 0.08 wt. % to 1.2 wt. %.

19. The device according to claim 1, wherein the device is located in a solar cell.

20. The device according to claim 19, wherein the solar cell is a solid-state solar cell.

* * * * *